(12) United States Patent
Basheer et al.

(10) Patent No.: US 7,790,814 B2
(45) Date of Patent: Sep. 7, 2010

(54) RADIOPAQUE POLYMERS FOR CIRCUIT BOARD ASSEMBLY

(75) Inventors: Rafil A. Basheer, Rochester Hills, MI (US); Derek B. Workman, Noblesville, IN (US)

(73) Assignee: Delphi Technologies, Inc., Troy, MI (US)

( * ) Notice: Subject to any disclaimer, the term of this patent is extended or adjusted under 35 U.S.C. 154(b) by 1203 days.

(21) Appl. No.: 11/099,399

(22) Filed: Apr. 5, 2005

(65) Prior Publication Data

US 2006/0222860 A1    Oct. 5, 2006

(51) Int. Cl.
C08G 59/14    (2006.01)
B32B 27/38    (2006.01)

(52) U.S. Cl. ...................... 525/523; 428/414
(58) Field of Classification Search .............. 428/414; 525/523
See application file for complete search history.

(56) References Cited

U.S. PATENT DOCUMENTS 3,852,341 A    12/1974 Lindberg et al.
5,942,182 A *  8/1999 Hoge et al. ............ 264/510
2003/0069331 A1 *  4/2003 Teiichi et al. ............ 523/176
2003/0219673 A1 * 11/2003 Tao et al. ................ 430/163
2004/0091686 A1 *  5/2004 Okamoto et al. ......... 428/209

FOREIGN PATENT DOCUMENTS

EP    0240459    * 10/1987
JP    02304003      12/1990

OTHER PUBLICATIONS

Patnaik, Pradyot (2003). Handbook of Inorganic Chemicals. (pp. 397). McGraw-Hill. Online version available at: http://www.knovel.com/knovel2/Toc.jsp?BookID=688&VerticalID=0.*
EP Search Report dated Jul. 14, 2006.
"Sharpen x-ray images", Kenridge, B., Test & Measurement Europe—*Test & Measurement World*, Jun. 1, 2002, two pages.

* cited by examiner

*Primary Examiner*—Mark Eashoo
*Assistant Examiner*—Megan McCulley
(74) *Attorney, Agent, or Firm*—Jimmy L. Funke

(57) ABSTRACT

The thermosetable composition incorporating organo-iodine compounds that provide improved x-ray contrast are prepared by reacting an epoxy resin with crosslinking agents, wherein the crosslinking agents include compounds having iodo-phenyl functionalities, and wherein the iodine atoms include iodine-127 isotope. The resulting thermoset material includes sufficient iodine-127 isotope covalently bound to the polymer matrix to impart excellent x-ray contrast. The cured polymer materials of this invention may be utilized as underfill material for electrical components, thereby facilitating use of x-ray analysis to detect problematic voids in the underfill.

19 Claims, 3 Drawing Sheets

RADIOPAQUE POLYMERS FOR CIRCUIT BOARD ASSEMBLY

TECHNICAL FIELD

This invention relates to radiopaque polymers and circuit board assemblies employing radiopaque underfill material.

BACKGROUND OF THE INVENTION

Underfill materials for circuit board assembly are adhesives that are employed for the attachment of devices, such as flip chips, to electronic substrates. These adhesives provide a means for the mechanical connection between the device and the substrate which relieves stress on the solder joints and improves the reliability of the assembly. Voids in the underfill layer are problematic because compressive forces can cause extrusion of solder into the void regions. If the void spans the area between adjacent solder joints, solder extrusion can ultimately cause an electrical short. C-mode scanning acoustic microscopy, C-SAM, can be used for the detection of these voids, but the process is relatively slow and requires submersion of the sample in water. Therefore, this is not an attractive method for the inspection of underfilled devices in a manufacturing environment because the water bath is a potential source of ionic and microbial contamination. X-ray analysis of underfilled assemblies is not a viable option in most cases because the degree of contrast between the void regions and the underfill is typically quite low. Conventional methods for increasing contrast by the addition of inorganic oxides such as $Y_2O_3$ are not practical for either capillary or no-flow (self-fluxing) underfills. Capilally underfills are typically heavily filled, and the addition of more filler in the form of radio contrast agents should have a negative impact on viscosity. Furthermore, uniform dispersion of the radio contrast agent provides additional challenges that must be met. No-flow underfills are typically unfilled because filler particles in the underfill could be incorporated into the solder joints. Therefore, incorporation of conventional metal oxide particles is not a viable solution for increasing the X-ray opacity of no-flow underfills.

SUMMARY OF THE INVENTION

This invention pertains to the development of polymers that incorporate organo-iodine compounds for improved X-ray contrast. These polymers employ iodo-phenyl functionalities which do not introduce a hydrolysable form of iodine into the electronic assembly. The 127 isotope is 100% naturally abundant and it is stable. Therefore, these formulations are not a potential source of alpha emission. The radiopacifying agents are uniformly dispersed throughout the resin and covalently bound to the polymer matrix upon curing. Consequently, they do not have the problem of separation from the resin as in the case of the metal oxides.

These and other features, advantages and objects of the present invention will be further understood and appreciated by those skilled in the art by reference to the following specification, claims and appended drawings.

DETAILED DESCRIPTION OF PREFERRED EMBODIMENTS

Figure 1:
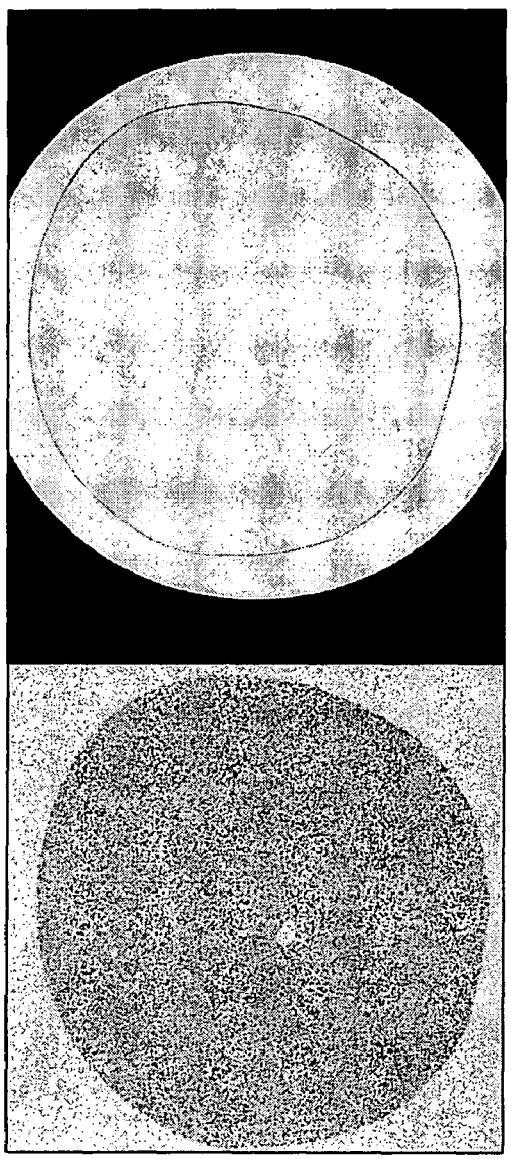
FIG. 1 shows an x-ray image of formulations containing approximately 10% triiodophenol by weight.

The most common thermosetting materials used in the packaging of electronic components are those formulated from epoxy resins. This is due to their widely recognized properties of excellent adhesion to a variety of substrates, high, strength, good thermal stability, absence of volatile by-products during cure, and ease of processing. The epoxy resins are a family of products ranging in properties from low viscosity liquids to friable solids of higher molecular weights. As such, they provide a broad latitude in formulating compositions for a range of applications. Equally important is the epoxy resins ability of curing or reacting with several groups of other materials to produce a variety of thermosetting compositions. Thus, polyfunctional amines, either aliphatic or aromatic, are commonly used as curing agents, as are polyfunctional anhydrides. Consequently, there is great versatility available for manipulation of the resin/curing system.

Among the family of epoxy resins, the most widely used are those that are the reaction product of bisphenol A and epichlorohydrin, namely bisphenol A diepoxide. Typical curing compounds for this resin include polyfunctional amines, carboxylic acid anhydrides and imidazoles. Less common epoxy resins are the cycloaliphatic diepoxides. These are primarily cured with acid anhydrides in the presence of a catalyst or with polyols by cationic initiation.

Epoxy resins thermosets provide excellent electrical insulating properties, dielectric and resistivity characteristics, and will retain such properties under severe operating conditions. A special electronic packaging application of epoxy resins involves their utilization as underfill materials in flip chip packaging. It is often desirable to monitor the flow of epoxy resin (both filled and unfilled) in confined places during cure to ensure complete filling of the gap between the chip and the substrate. This is particularly important since the underfill functions both as an adhesive and as a material that lowers the CTE mismatch which exists between the silicon chip and the organic substrate.

We have observed that x-ray radiopaque imaging of underfill materials can be achieved by the incorporation of iodine containing compounds in the epoxy resin underfill formulations. The radiopaque material may be incorporated as solid filler particles (physical blend) into the epoxy formulation. However, particle segregation and increased viscosity issues may affect the reliability of imaging of these formulations.

Alternatively, the radiopaque material may be selected such that it contains a suitable reactive functionality to allow for its integration into the chemical structure of the thermoset composition. Upon curing, such a three dimensional network for which the radiopaque material is an integral part of the chemical structure leads to a high uniformity of dispersion of the radiopaque molecules in the underfill. The choice of the reactive functionality of the radiopaque material is limited by the chemical nature of the epoxy resin and the curing agent. It is also important that the functionalized radiopaque materials have significant solubility in the epoxy resin formulation before or during the curing process. Because of the large number of different epoxy resins/curing systems that can be used in underfill formulations, we will describe the invention by way of examples.

Epoxy-Amine Formulations: Polyfunctional amines, both aliphatic and aromatic, are the most common of the curing agents used in epoxy resin formulations. The aromatic amines are high temperature curing agents, and as such, require acceleration when used to cure epoxy resins under conditions of solder reflow in underfill applications. Monohydroxy phenols are known to markedly accelerate the curing rate of epoxy resins by both aliphatic and aromatic polyamines. We have used triiodophenol to accelerate the reaction of Bisphenol A epoxy resins and liquid aromatic polyamines (Table I). The triiodo substituents provide for the radiopaque property in the x-ray imaging of the cured product. FIG. 1 shows an x-ray image of formulations containing approximately 10% triiodophenol by weight.

TABLE I

Amine Cure of bisphenol A Diglycidyl Ether[1] Formulation

| Ingredient | Amount (parts) |
| --- | --- |
| RSL 1462[2] | 100 |
| Ethacure 100[3] | 25 |
| Triiodophenol | 6.25 (5%), or 12.5 (10%), or 25 (20%) |

Figure 2:
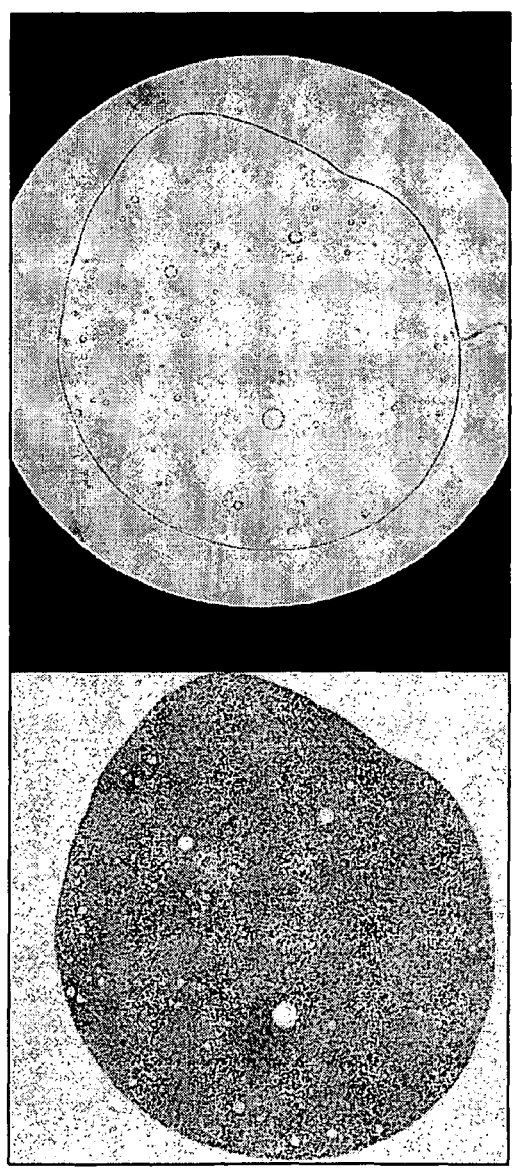
FIG. 2 is an x-ray image of cured thermosets containing approximately 10% by weight of triiodocarboxylic acid.

[1]Curing at 150° C. for 15 minutes. Other curing conditions are equally valid.
[2]RSL 1462 is a bisphenol A diepoxide having an epoxy equivalent weight of 180 obtained from Resolution Performance Products.
[3]Ethacure 100 is a diethyltoluene diamine with an amine hydrogen equivalent of 45 from Air Products and Chemicals Epoxy-Anhydride Formulations: Acid anhydrides are the next most important class of epoxy curing agents. These compounds do not react with epoxy resins except in the presence of active hydrogens, such as water, hydroxyl or Lewis acids. The radiopaque triiodophenol, which contains a hydroxyl group, can therefore be used as the active hydrogen compound. Alternatively, organic acids have been shown to react with epoxy resins at high temperatures and, hence, may be incorporated as an epoxy co-curing agent along with acid anhydrides. Thus we have used the radiopaque triiodocarboxylic acid as a co-reactant with an acid anhydride to cure Bis-phenol A epoxy resin. Table II shows an example of such a formulation. FIG. 2 provides an x-ray image of cured thermosets containing approximately 10% by weight of triiodocarboxylic acid.

TABLE II

Anhydride Cure of bisphenol A Diepoxide[1] Formulation

| Ingredient | Amount (parts) |
| --- | --- |
| RSL 1462 | 100 |
| MTHPA[2] | 80 |
| BDMA[3] | 2 |
| Triiodobenoic Acid | 9 (5%), or 18 (10%), or 36 (20%) |

[1]Curing at 150° C. for 3 hours. Other curing conditions are equally valid.
[2]MTHPA is methyltetrahydrophthalic anhydride from Lonza Corporation.
[3]BDMA is benzyl dimethylamine from Aldrich Chemical Co.

Cycloalilphatic Epoxy-Polyol Formulations: Cycloaliphatic epoxy resins are not as widely used as aromatic glycidyl ethers and, furthermore, are not reactive towards polyamine curing agents. They are, however, highly reactive to acidic hardeners. The most common curing agents are anhydrides, anhydrides and polyols, or polyols alone. These reactions are catalyzed by Lewis acids or tertiary amine type of compounds. Radiopaque characteristics can be imparted to such formulations by the incorporation of triiodobenzyl alcohol. Network connectivity of this radiopaque material occurs through the reaction of the hydroxyl group of the alcohol. Table III shows a representative formulation involving the radiopaque triiodobenzyl alcohol.

TABLE III

Cycloaliphatic Epoxy/Anhydride/Polyol[1] Formulation

| Ingredient | Amount (parts) |
| --- | --- |
| Boltorn H20[2] | 15 |
| ERL 4221[3] | 85 |
| Triiodobenzyl Alcohol | 5 (5%), or 10 (10%), or 20 (20%) |
| Nacure A218[4] | 3.6 |

[1]Curing at 150° C. for 15 minutes. Other curing conditions are equally valid.
[2]Boltorn is a dendritic polyol from Perstrop Specialty Chemicals.
[3]ERL 4221 is 3, 4-epoxycyclohexyl methyl-3, 4-epoxy-cyclohexane carboxylate from the Dow Chemical Company.
[4]Nacure A218 is a Lewis Acid (zinc salt) from King Industries.

Figure 3:
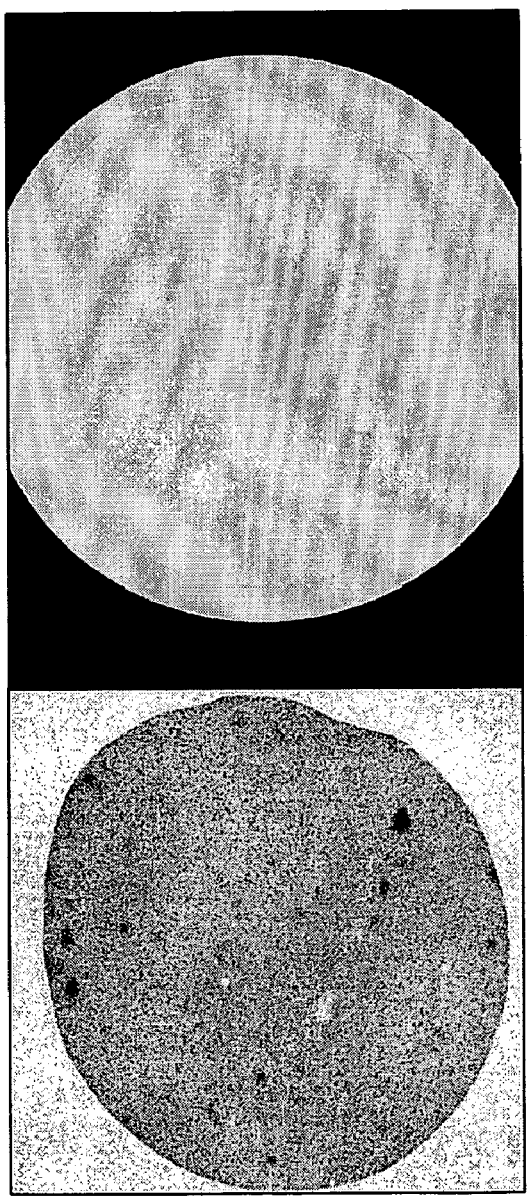
FIG. 3 is an x-ray image of cycloaliphatic epoxy thermoset containing approximately 20% by weight of triiodobenzly alcohol.

FIG. 3 shows x-ray image of cycloaliphatic epoxy thermoset containing approximately 20% by weight of triiodobenzyl alcohol.

Figure 4:
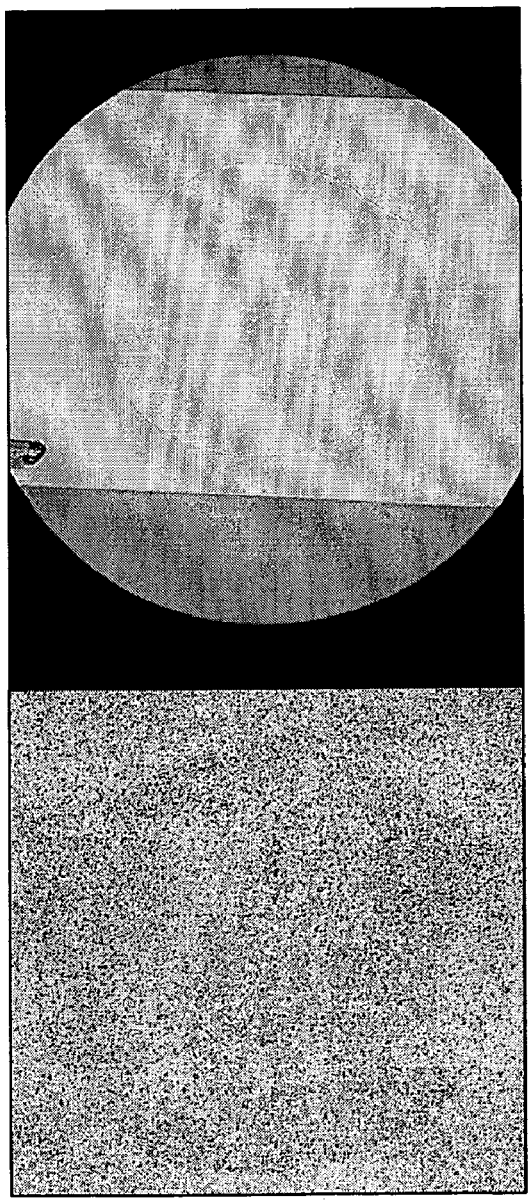
FIG. 4 is an x-ray image of cycloaliphatic epoxy thermoset employing a crosslinking agent without iodo-phenyl functionalities.

Blank formulations containing no iodine element, e.g. phenol replacing triiodophenol in Table 1, were prepared and cured accordingly. As illustration in FIG. 4, very little contrast is observed in the corresponding x-ray image.

The preferred concentration of iodine containing radiopaque material in any formulation is from 1% to 50% by weight of total composition. More preferably the concentration is between 5% and 20% of total composition. Compounds containing three iodine groups are preferred over those containing fewer iodine groups. However, compounds containing fewer than three iodine groups may also be utilized, although the high iodine concentration per molecule is expected to provide better image resolution for a given mass of the radiopaque material. Furthermore, radiopaque compounds containing more than one reactive functional group but otherwise similar number of iodo groups are preferred over those with a single reactive functional group in as far as the former provide higher cross-linking density to the resulting underfill. The reactive groups of the radiopaque compound do not necessarily have to be similar in functionality as long as neither of the functional groups causes inhibition or retardation of the essential thermosetting reactions of the underfill. Groups that are not reactive in the cross-linking process but are present as part of the radiopaque compound to impact other functions such as greater solubility in the underfill composition may also be used. Similarly, mixtures of iodo radiopaque compounds having different reactive functionalities and/or different number of iodo groups may be utilized to achieve the desired reaction and imaging requirements.

Figure 5:
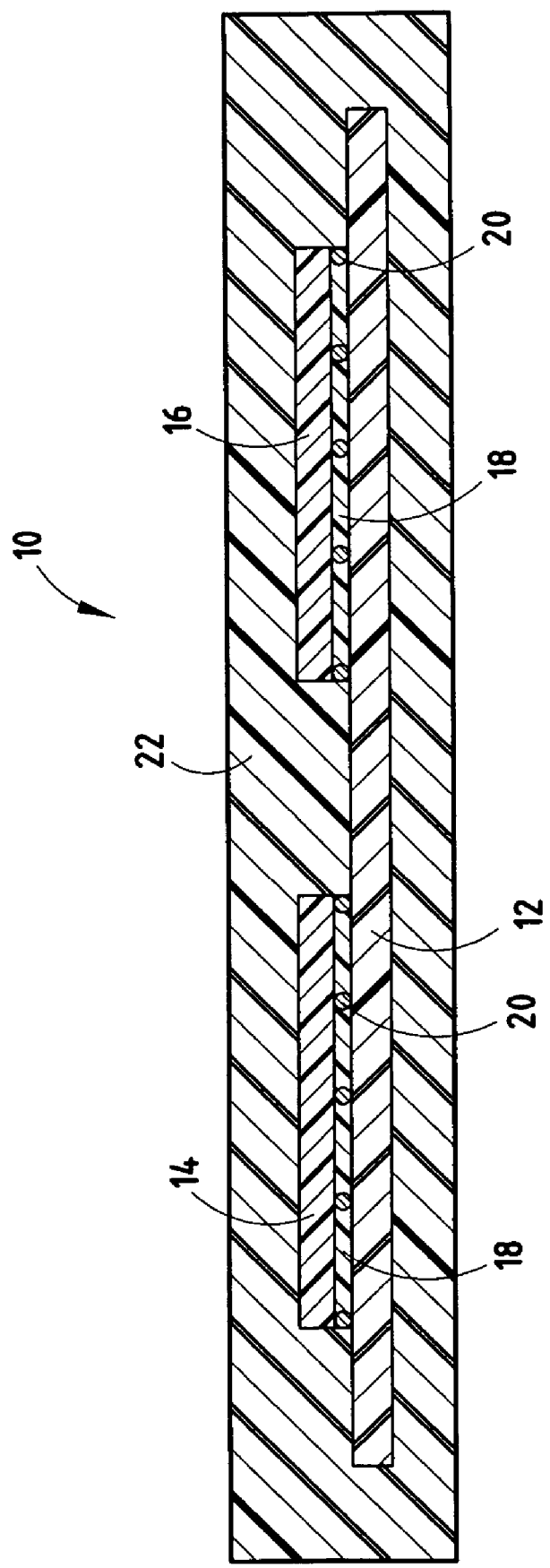
FIG. 5 is a schematic cross section of an underfilled electrical component.

FIG. 5 shows an electrical component 10 in accordance with an embodiment of the invention. Electrical component 10 includes a circuit board 12 (e.g., a printed circuit board) and electronic devices 14, 16 (e.g., semi-conductor chips) mounted on and electrically connected to conductive pathways of substrate circuit board 12. A thermoset matrix underfill 18 having iodine-127 atom covalently bound to the polymer matrix is disposed between an underside of electronic device 16 and an upper surface of substrate circuit board 12. The standoff height for a flip chip is typically about 75 to 100 microns. Electronic devices 14 and 16 are electrically connected to electrically conductive pathways or circuit segments by solder connections 20. As shown in the illustrated embodiment, the entire electrical component 10 may be encapsulated in a thermoset material 22, which may be the same as, or different from, the underfill material 18. Alternatively, electronic devices 14 and 16 may be overmolded with a thermoset material that is the same as, or different from, thermoset material 18.

Other potential applications for the thermosetable compositions of this invention and the resulting thermoset material include various adhesive compositions in which it would be desirable to subject the resulting joint to x-ray analysis, medical devices such as implants, catheters and tubing, dental devices, cements for orthopaedic and dental applications, radiopaque polymers for firearms, packaging for photographic film, medical imaging, and therapeutic applications.

It will be understood by those who practice the invention and those skilled in the art, that various modifications and improvements may be made to the invention without departing from the spirit of the disclosed concept. The scope of protection afforded is to be determined by the claims and by the breadth of interpretation allowed by law.

The invention claimed is:

1. A thermosetable composition, comprising:
   an epoxy resin; and
   an organo-iodine crosslinking agent having covalently bound iodine-127 isotope in sufficient quantity to provide improved X-ray contrast as compared with a composition that does not have iodine-127.

2. The thermosetable composition of claim 1, wherein the epoxy resin is bisphenol A diepoxide.

3. The thermosetable composition of claim 1, wherein the epoxy resin is a cycloaliphatic epoxy resin.

4. The thermosetable composition of claim 1, further comprising an amine crosslinking agent.

5. The thermosetable composition of claim 1, further comprising an anhydride crosslinking agent.

6. The thermosetable composition of claim 1, further comprising a polyol crosslinking agent.

7. The thermosetable composition of claim 1, wherein the organo-iodine crosslinking agent has iodo-phenyl functionalities.

8. The thermosetable composition of claim 1, wherein the organo-iodine crosslinking agent is triiodophenol.

9. The thermosetable composition of claim 1, wherein the organo-iodine crosslinking agent comprises from about 1% to about 50% by weight of the total composition.

10. The thermosetable composition of claim 1, wherein the organo-iodine crosslinking agent comprises from about 5% to about 20% by weight of the total composition.

11. A thermoset material comprising:
    a crosslinked epoxy resin having a sufficient quantity of iodine-127 covalently bound to the crosslinked resin to provide improved X-ray contrast as compared with a composition that does not have iodine-127.

12. The thermoset material of claim 11, prepared by reaction of an epoxy resin with one or more crosslinking agents, at least one of the crosslinking agents being an organo-iodine compound.

13. A thermoset material comprising:
    a crosslinked epoxy resin having iodine atoms covalently bound to the crosslinking resin, the thermoset material prepared by reaction of an epoxy resin with one or more crosslinking agents, at least one of the crosslinking agents being an organo-iodine compound, wherein the organo-iodine compound comprises from about 1% to about 50% by weight of a reaction composition comprising the epoxy resin and the crosslinking agents.

14. The thermoset material of claim 13, wherein the organo-iodine compound comprises from about 5% to about 20% by weight of a reaction composition comprising the epoxy resin and the crosslinking agents.

15. An electrical component comprising:
    a circuit board (10);
    an electrical device mounted on the circuit board (14), the electrical device being spaced from the circuit board; and
    a cross-linked epoxy resin underfill (18) disposed between the circuit board (10) and the electrical device (14), the crosslinked epoxy resin having a sufficient quantity of covalently bound iodine-127 isotope to provide improved X-ray contrast as compared with a composition that does not have iodine-127.

16. The electrical component of claim 15, wherein the iodine atoms are iodine-127 isotope.

17. The electrical component of claim 15, wherein the crosslinked epoxy resin is the reaction product of an epoxy resin and an organo-iodine crosslinking agent.

18. The electrical component of claim 17, wherein the organo-iodine crosslinking agent comprises from about 1% to about 50% by weight of a composition used to prepare the underfill.

19. The electrical component of claim 17, wherein the organo-iodine crosslinking agent comprises from about 5% to about 20% by weight of a composition used to prepare the underfill.

* * * * *